(12) United States Patent
Mazahreh et al.

(10) Patent No.: US 9,287,899 B1
(45) Date of Patent: Mar. 15, 2016

(54) FORWARD ERROR CORRECTION

(71) Applicant: Xilinx, Inc., San Jose, CA (US)

(72) Inventors: Raied N. Mazahreh, Sandy, UT (US); Raghavendar M. Rao, Austin, TX (US); Krishna R. Narayanan, College Station, TX (US); Henry D. Pfister, Bryan, TX (US)

(73) Assignee: XILINX, INC., San Jose, CA (US)

( * ) Notice: Subject to any disclaimer, the term of this patent is extended or adjusted under 35 U.S.C. 154(b) by 110 days.

(21) Appl. No.: 14/137,812

(22) Filed: Dec. 20, 2013

(51) Int. Cl.
*H03M 13/27* (2006.01)
(52) U.S. Cl.
CPC .................................. *H03M 13/2707* (2013.01)
(58) Field of Classification Search
CPC .......... H03M 13/1128; H03M 13/116; H03M 13/1108; H03M 13/1142; H03M 13/1111; H03M 13/2707
See application file for complete search history.

(56) References Cited

U.S. PATENT DOCUMENTS

| | | | | |
|---|---|---|---|---|
| 7,774,688 | B1 * | 8/2010 | Teng et al. | 714/782 |
| 8,301,984 | B1 * | 10/2012 | Zhang et al. | 714/780 |
| 2008/0126908 | A1 * | 5/2008 | Lin | 714/758 |
| 2009/0292967 | A1 * | 11/2009 | Sasaki | 714/752 |
| 2011/0103236 | A1 * | 5/2011 | Li | 370/252 |
| 2012/0266051 | A1 * | 10/2012 | Farhoodfar et al. | 714/782 |

OTHER PUBLICATIONS

Feltstrom, A.J., et al., "Braided Block Codes," IEEE Transactions on Information Theory, vol. 55, Issue 6, pp. 2640-2658, Jun. 2009.
Jian, Yung-Yih, et al., "Approaching Capacity at High Rates with Iterative Hard-Decision Decoding", Information Theory Proceedings (ISIT), 2012 IEEE International Symposium on, pp. 2696-2700, Jul. 1-6, 2012, Dept. of Electrical & Computer Engineering, College Station, TX US.
Lentmaier, M. et al., "Density evolution analysis of Protograph-based braided block codes on the erasure channel," In Proc. 8th Intern. ITG Conf. on Source and Channel Coding (SCC), pp. 1-6, Feb. 2010, Siegen, Germany.
U.S. Appl. No. 13/691,501, Pfister, et al., filed Nov. 30, 2012, San Jose, CA USA.
U.S. Appl. No. 13/672,367, Mazahreh, et al., filed Nov. 8, 2012, San Jose, CA USA.

(Continued)

*Primary Examiner* — Guy Lamarre
(74) *Attorney, Agent, or Firm* — LeRoy D. Maunu

(57) ABSTRACT

Methods and circuits are disclosed for forward-error-correction (FEC) decoding. A plurality of symbols are received in an interleaved format of rows and columns of the symbols. A plurality of FEC decoding iterations are performed on the plurality of symbols. Each decoding iteration performs FEC decoding of the rows of the plurality of symbols and performs FEC decoding of the columns of the plurality of symbols. After performing the decoding iterations, rows in error and columns in error of the plurality of symbols are determined. In response to the determined rows in error and the determined columns in error matching a deadlock pattern, symbols at intersections of the determined rows and columns in error are determined. Bits of one or more symbols of the determined symbols are inverted. After the inverting of the bits, one or more of the FEC decoding iterations are performed.

20 Claims, 12 Drawing Sheets

(56) References Cited

OTHER PUBLICATIONS

U.S. Appl. No. 13/425,363, Poh Meng Hwee, et al., filed Mar. 20, 2012, San Jose, CA USA.

International Telecommunication Union, ITU-T Recommendation G975.1, Forward Error Correction for High Bit-Rate DWDM Submarine Systems, pp. 1-58, Feb. 22, 2004, Geneve, Switzerland.

* cited by examiner ized description and upon reference to the drawings in
FORWARD ERROR CORRECTION

FIELD OF THE INVENTION

The disclosure generally relates to forward error correction.

BACKGROUND

Forward error correction plays a critical role in high bit rate communications. Forward error correction (FEC) is often used to detect and correct symbols of a data packet received in error and thereby eliminate the need for retransmission of the packet. Prior to transmission of a message, redundancy is added to facilitate FEC of the message following transmission. Some example error correction codes include Hamming, Bose-Chaudhuri-Hochquenghem (BCH), Reed-Solomon (RS), Viterbi, trellis, etc.

SUMMARY

A method for FEC decoding is provided. A plurality of symbols are received in an interleaved format of rows and columns of the symbols. A plurality of FEC decoding iterations are performed on the plurality of symbols. Each decoding iteration includes performing FEC decoding of the rows of the plurality of symbols and FEC decoding of the columns of the plurality of symbols. After performing the decoding iterations, rows in error and columns in error of the plurality of symbols are determined. In response to the determined rows in error and the determined columns in error matching a deadlock pattern, symbols at intersections of the determined rows and columns in error are determined. Bits of one or more symbols of the determined symbols are inverted. After the inverting of the bits, one or more of the FEC decoding iterations are performed.

A circuit for FEC decoding is also provided. The circuit includes a first FEC decoder configured to receive a first set of symbols in an interleaved format, having rows of the symbols interleaved with columns of the symbols. The first FEC decoder performs a plurality of FEC decoding iterations on the set of symbols to produce a second set of symbols. Each decoding iteration includes FEC decoding of the rows of the first set of symbols and FEC decoding of the columns of the first set of symbols. The circuit also includes a deadlock recovery circuit coupled to the first FEC decoder. The deadlock recovery circuit is configured to determine rows and columns of symbols in error in the second set of symbols. In response to the determined rows and columns of symbols in error matching a deadlock pattern, the deadlock recovery circuit inverts bits of one or more symbols of the second set of symbols at the intersection points to produce a third set of symbols. The circuit also includes a second FEC decoder coupled to the deadlock recovery circuit. The second FEC decoder is configured to perform one or more of the FEC decoding iterations on the third set of symbols.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Methods and circuits are disclosed for FEC decoding of braided FEC codes. Braided FEC codes arrange data symbols into a diagonal two-dimensional array that may be extended indefinitely. Rows and columns of the diagonal array are each encoded to produce respective sets of parity bit information that may be used to recover data symbols that are lost or become corrupted in transmission. The maximum number of symbols that may be corrected in a row or column depends on the coding algorithm used and the number of parity bits included in each FEC datagram. As explained in more detail in the following paragraphs, by iteratively alternating between FEC decoding rows and FEC decoding columns, a larger number of missing data symbols may be recovered. However, in certain situations, symbols in error may be distributed in a pattern that prevents symbols from being correctable with either row decoding or column decoding. For ease of reference, the inability to correct errors via row decoding and column decoding may be referred to as deadlock. Various methods and systems are disclosed for the correction of symbols in a deadlock scenario.

Figure 1:
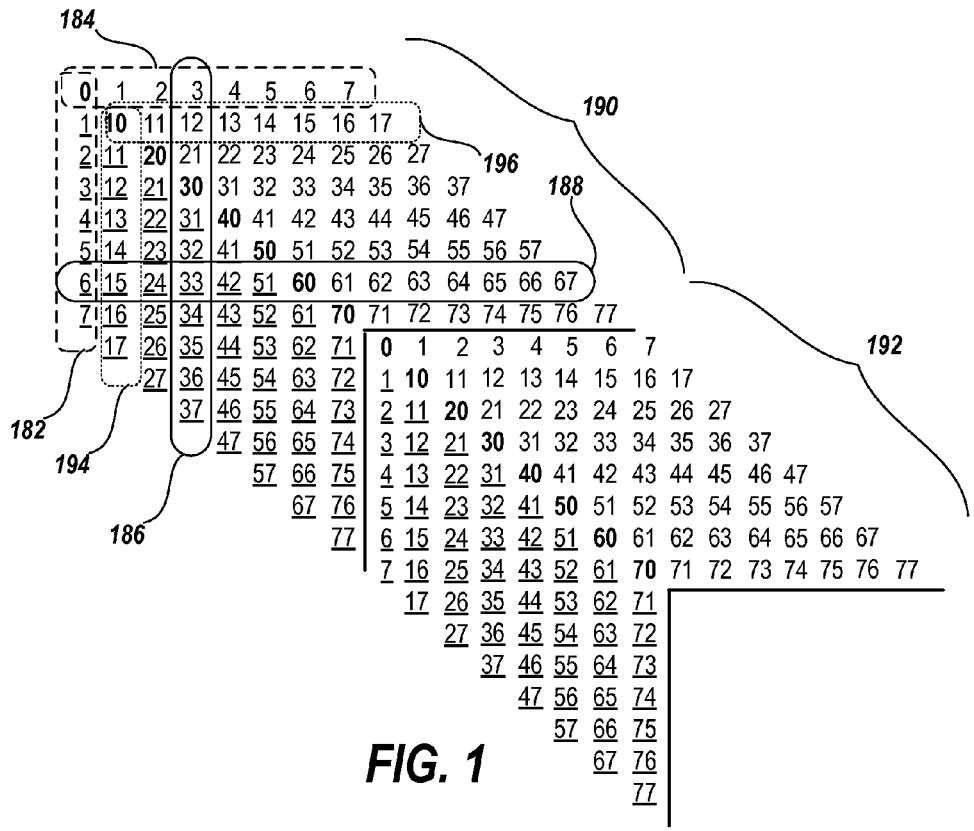
FIG. 1 shows a diagonal two-dimensional matrix of data symbols for braided FEC codes.

FIG. 1 shows a matrix of data symbols for an FEC braided block code. A braided block code arranges data symbols into a diagonal two-dimensional array that may be extended indefinitely. Data symbols are arranged into respective pairs of overlapping vertical and horizontal symbol segments (e.g., symbol segment pair 182 and 184 and segment pair 194 and 196), where a topmost symbol of the vertical segment is also included in the corresponding horizontal symbol segment. In this example, symbols in the vertical symbol segments are underlined, and symbols shared between vertical and horizontal segments are shown as bold numerals. The segment pairs are arranged diagonally. Segment pairs are diagonally appended to form the diagonal matrix. For instance, the segment pair 194 and 196 is located diagonally below and to the right of the segment pair, which includes segments 182 and 184, having shared symbol 0. The diagonal matrix may be extended indefinitely to include multiple data blocks. For instance, in the example shown in FIG. 1, the diagonal matrix is extended to include two data blocks 190 and 192. For ease of reference, the diagonal matrix arrangement may be referred to as a de-interleaved format.

For each row and column (e.g., row 188 and column 186) of the de-interleaved format, a respective set of parity bits is generated that may be used to detect and/or recover from errors in the respective row or column. In the de-interleaved format, each data symbol is separately encoded in one row and one column. For example, a first set of parity bits is determined for column 186 and a second set of parity bits is generated for row 188. Respective sets of parity bits are also generated for each of the other rows and columns in the de-interleaved format. For ease of reference, the parity bits generated for a respective row or column may be referred to as an FEC datagram. FEC datagrams may be calculated for each row and column of symbols in the de-interleaved format using a number of coding algorithms including, for example, Hamming, RS, BCH, Viterbi, Trellis, XOR, etc. For ease of reference, examples are primarily described as having datagrams generated using BCH encoding. However, the examples may be modified to alternatively or additionally utilize other coding algorithms as well.

In performing FEC decoding of a block of data symbols after transmission, one or more symbols in a row or column may be corrected using a corresponding FEC datagram. The maximum number of bits that may be corrected in a row or column depends on the coding algorithm used and the number of parity bits included in each FEC datagram. For instance, the BCH (1023, 991) code can be used to correct up to three bits in error. If a row includes more bits in error than the maximum number of data symbols that can be corrected, correction cannot be performed using the corresponding row FEC datagram. However, even if a row contains more bits in error than the maximum, some of the data symbols in error may be recovered in their respective columns using the column FEC datagrams. After recovering the one or more symbols using the column FEC datagrams, the number of bits in error of the row may be less than the maximum number. If so, the remaining data symbols in error in the row may possibly be corrected using the corresponding row FEC datagram. By iteratively alternating between FEC decoding rows and FEC decoding columns, a larger number of missing data symbols may be recovered.

Figure 2:
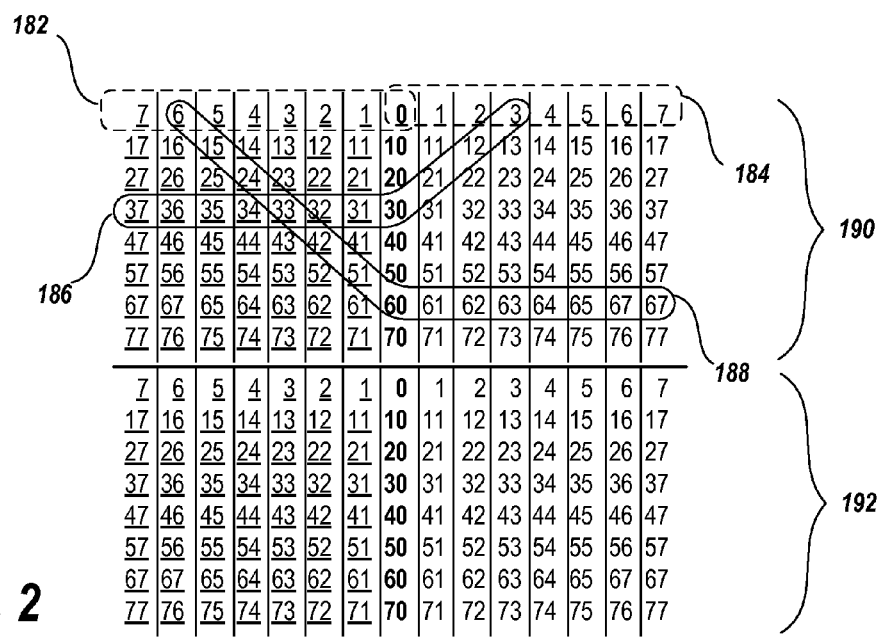
FIG. 2 shows the matrix of data symbols of FIG. 1 arranged in an interleaved format.

To facilitate transmission, columns of the symbols in the de-interleaved format may be shifted to arrange the symbols into a rectangular matrix used by most transport protocols. This shifting causes portions of the rows and columns of the data block in the de-interleaved format to become interleaved. For ease of reference, the rectangular matrix rearrangement of symbols from a de-interleaved data block (e.g., FIG. 1) may be referred to as an interleaved format. FIG. 2 shows the matrix of data symbols of FIG. 1 rearranged into an interleaved format. In the interleaved format, segments of each segment pair of the data blocks in the de-interleaved format shown in FIG. 1 are aligned in a respective row of the rectangular matrix. For instance, segments of the segment pair having vertical and horizontal segments 182 and 184 are aligned in the first row of the interleaved format shown in FIG. 2. In this alignment, rows and columns of the de-interleaved format (e.g., 188 and 186) become interleaved. For instance, symbols of column 186 of the braided FEC format are aligned in the fourth row in the left half of the interleaved format, but are interleaved in different rows (i.e., rows 1-3) in the right half of the interleaved format. Conversely, symbols of row 188 of the de-interleaved format are aligned in the seventh row in the right half of the interleaved format, but are interleaved in different rows (i.e., rows 1-6) in the left half of the interleaved format.

For ease of explanation, the examples are primarily described with reference to transmission of the symbols in the interleaved format shown in FIG. 2. However, it is understood that symbols may be transmitted in other formats as well. For example, the rows of the de-interleaved format may be interleaved with columns of the de-interleaved format.

In the data blocks 190 and 192 shown in FIGS. 1 and 2, each of the vertical and horizontal segments (e.g., 182 and 184) include seven symbols in addition to the shared symbol of the pair. As a result, the data block in the de-interleaved format and the interleaved format includes 15 columns (7*2+1). However, the embodiments are not so limited. Rather, the size of vertical and horizontal segments may be increased or decreased as required for different applications. For instance, for BCH (1023, 991) coding (1023 bit codewords having 991 data bits and 32 parity bits), a data block may be arranged into 3-bit symbols with 170 symbols in each of the vertical and horizontal segments in addition to the shared symbol ((170*2+1)*3=1023). For ease of illustration and explanation, interleaving and de-interleaving of the braided FEC data is primarily described with reference to one of the data blocks (e.g., 190) in the 15-column example shown in FIGS. 1 and 2.

In many communication systems, a receiver is generally configured to receive data in rectangular matrices, either one row or one column at a time. For ease of reference, the examples and embodiments are primarily described with reference to a communication system that receives data in the rectangular interleaved format one row at a time. Due to the interleaving of the rows and columns of the de-interleaved format when rearranged into the interleaved format described above, rows and/or columns are de-interleaved before FEC decoding is performed using the parity bits to detect and/or correct errors in each row or column. Similarly, when encoding data to produce braided FEC coded data in the de-interleaved format (e.g., FIG. 1), data symbols to be encoded are generally received in a rectangular format, such as that shown in FIG. 2. The input rectangular data block is rearranged to align rows and columns of the symbols of the de-interleaved format before FEC is performed to determine parity bits for each row or column.

In the following discussion, various methods and systems are described for FEC coding and decoding, that efficiently convert data symbols between the interleaved format and other formats that align rows and columns of the de-interleaved format for FEC encoding or decoding. Rows and columns of the de-interleaved format are interleaved and de-interleaved by shifting columns of the symbols. For instance, in one application, an FEC decoder is configured to alternate between arranging data symbols in a row-aligned format for decoding of rows of the de-interleaved format and a column-aligned format for decoding of columns of the de-interleaved format. In the row-aligned format, the symbols are arranged such that symbols in each row correspond to a respective row of symbols in the de-interleaved format. When in the row-aligned format, rows of symbols (i.e., rows of the de-interleaved format) may be input to a first FEC decoder one at a time for performing FEC. In the column-aligned format, the symbols are arranged such that symbols in each column correspond to a respective column of symbols in the de-interleaved format. When in the column-aligned format, rows of symbols (i.e., columns of the de-interleaved format) may be input to a second FEC decoder one at a time for performing FEC on columns of symbols in the de-interleaved format.

Figure 3:
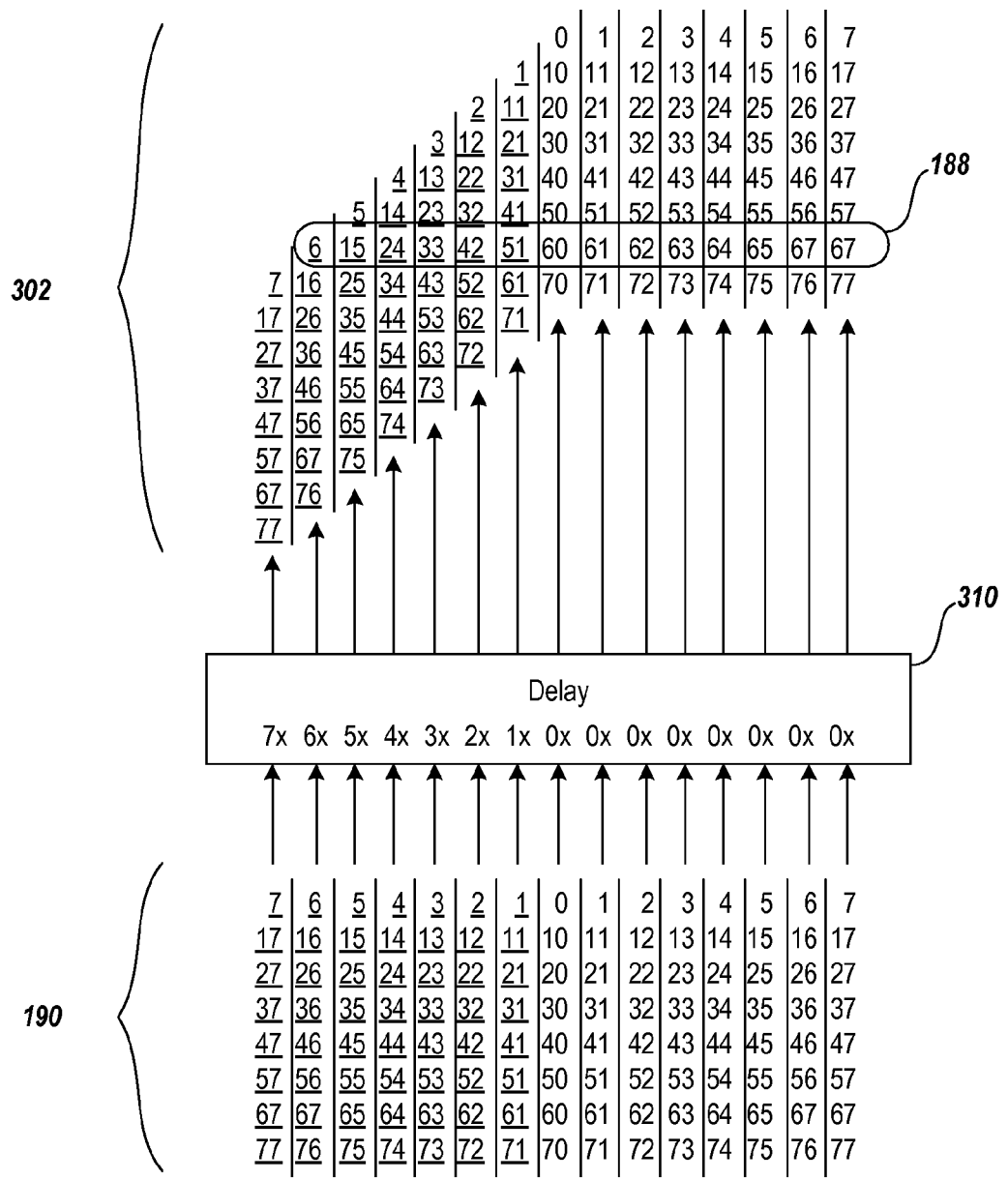
FIG. 3 illustrates shifting columns of data symbols from an interleaved data format into a row-aligned format.

FIG. 3 illustrates shifting columns of symbols from the interleaved format into a row-aligned format. In this example, the symbols of data block 190 in the interleaved format shown in FIG. 2 are rearranged to place the symbols into the row-aligned format 302. Columns in the left half of the interleaved format 190 are shifted to arrange the symbols into the row-aligned format 302. For instance, the symbols from the interleaved format that comprise row 188 of the de-interleaved format shown in FIG. 1, are aligned in the seventh row of the row-aligned format 302.

As indicated above, the rows of symbols of the interleaved format are received one at a time with symbols of each row of the interleaved format being received in parallel. For instance, the top row of the symbols in the interleaved format 190 may be received in parallel at time t0 and the second row may be received in parallel at time t1. In this example, columns are shifted by delaying symbols, corresponding to different columns, by different amounts of delay as rows are received. A delay circuit 310 delays symbols of the different columns. In this 15-column example, the leftmost seven columns are delayed by units of delay 7x, 6x, 5x, 4x, 3x, 2x, and 1x, respectively (x denotes a unit of delay equal to the number of bits in 1 symbol). The rightmost seven columns and the center column are not delayed (0x units of delay). In general, for a block of symbols in the interleaved format having L columns, the $(L-1)/2$ leftmost columns are each delayed by a respective number of delay units equal to a difference between an index of the column and an index of the center column $(L+1)/2$. As a result of the delays, the columns are shifted to place the symbols into the row-aligned format 302.

Figure 4:
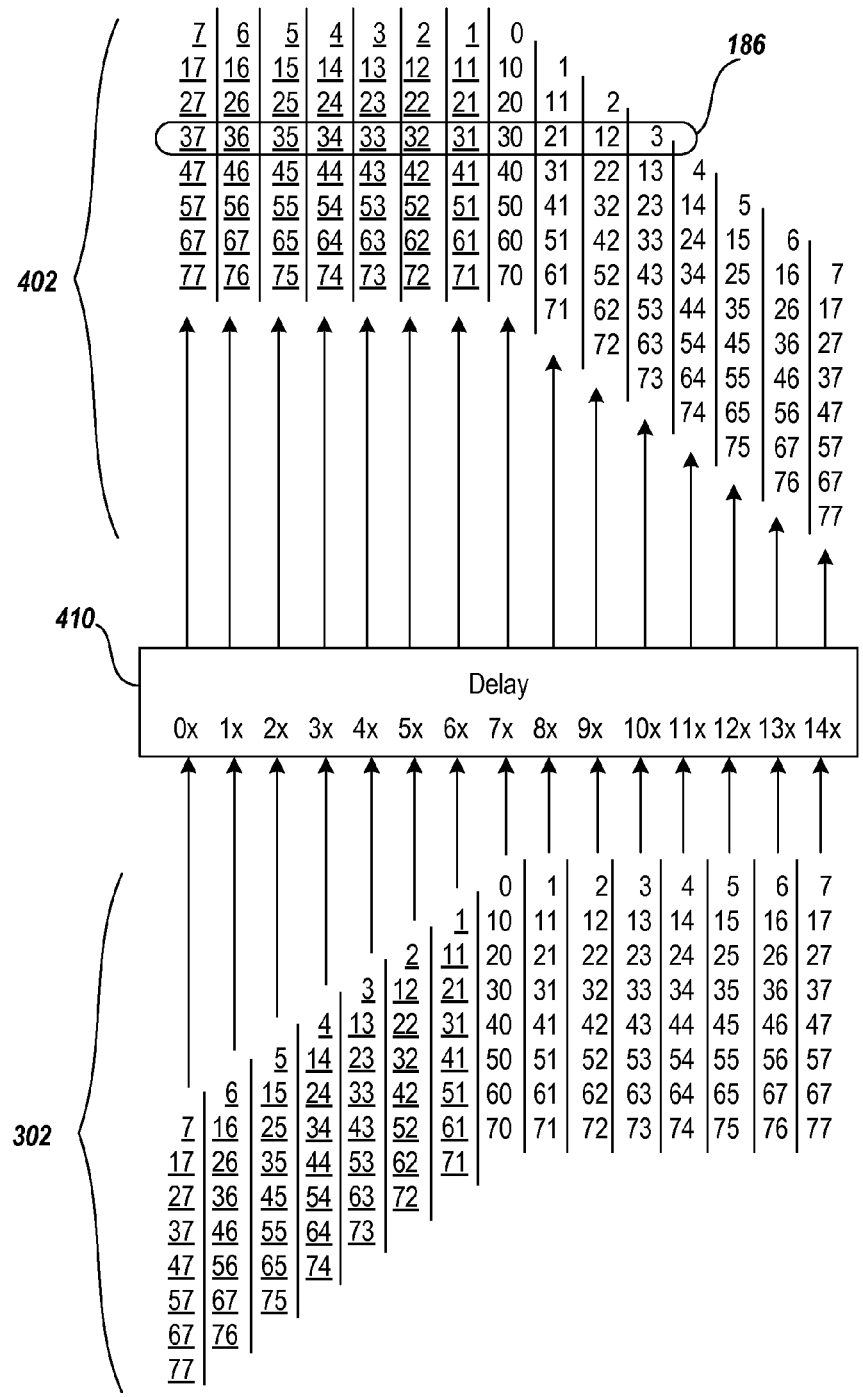
FIG. 4 illustrates shifting columns of data symbols from the row-aligned format into a column-aligned format.

FIG. 4 illustrates shifting columns of symbols in the row-aligned format to place the symbols into a column-aligned format. In this example, the symbols in the row-aligned format 302 shown in FIG. 3 are rearranged to place the symbols into the column-aligned format 402. As described with reference to block 310 in FIG. 3, the columns of the symbols in the row-aligned format 302 are shifted to arrange the symbols into the row-aligned format 402. For instance, symbols of column 186 in the de-interleaved format shown in FIG. 1 are aligned in the fourth row of the column-aligned format 402.

As described with reference to FIG. 3, columns are shifted by delaying symbols, corresponding to different columns by different amounts of delay as rows of the row-aligned format 302 are received. A delay circuit 410 delays symbols of the different columns. In this 15-column example, the columns are delayed by respective numbers of delay units 0x through 14x from the leftmost column to the rightmost column. In general, for a block of symbols in the interleaved format having L columns, each column is delayed by a respective number of delay units equal to an index of the column. The columns are indexed 0 to L−1, from the leftmost column to the rightmost. As a result of the delays, the columns are shifted to place the symbols into the column-aligned format 402.

Figure 5:
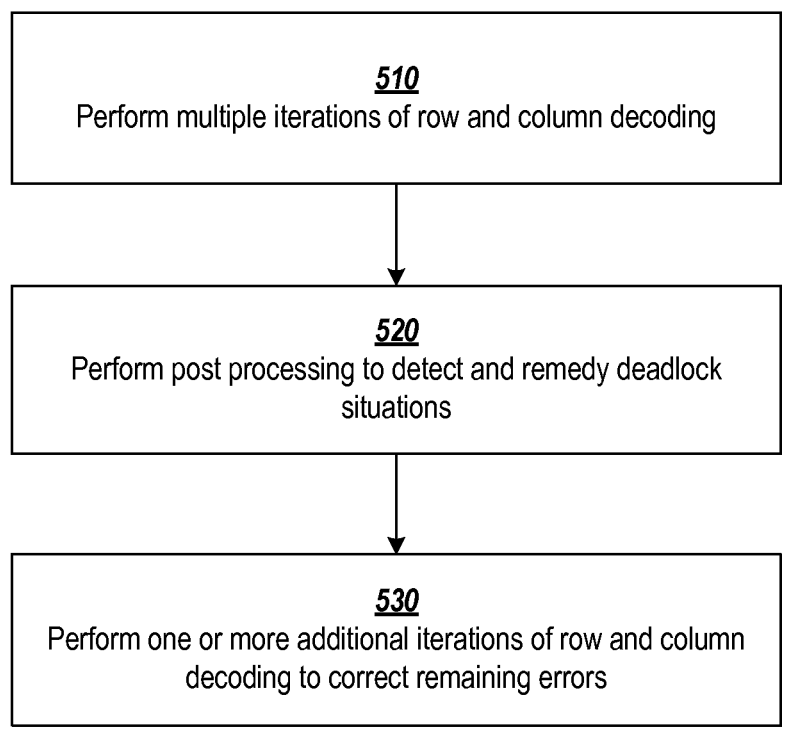
FIG. 5 shows a method for FEC decoding of a data block encoded with a braided FEC code.

FIG. 5 shows a process for FEC decoding of a data block encoded with a braided FEC code with post processing to overcome deadlock decoding scenarios. Multiple iterations of row and column decoding are performed at block 510. In each iteration, FEC decoding of rows is performed followed by FEC decoding of columns, or vice-versa.

As indicated above, deadlock may occur in decoding the rows and column. A deadlock occurs when errors are distributed in a pattern that prevents symbols from being corrected with either row decoding or column decoding. Post processing is performed at block 520 to detect and remedy such deadlock situations. After the post processing, one or more decoding iterations of row and column decoding are performed at block 530 to correct remaining errors.

Figure 6:
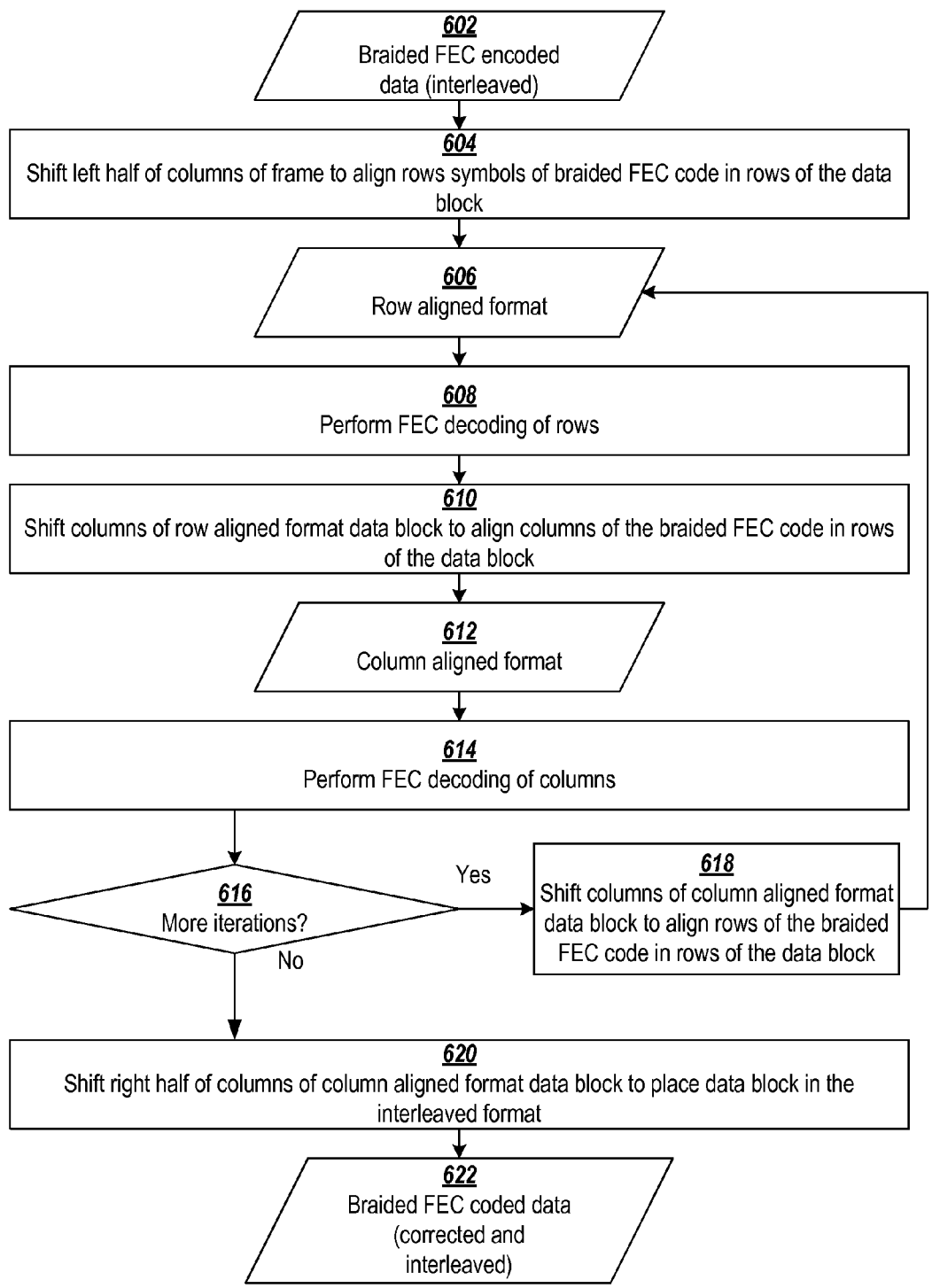
FIG. 6 shows a method for performing a number of decoding iterations of braided FEC encoded data.

FIG. 6 shows a process for performing a number of decoding iterations of braided FEC encoded data. The process may be used, for example, to perform the decoding iterations at blocks 510 and 530 in FIG. 5. A frame of data 602, encoded with a braided FEC code, is received in the interleaved format. The columns in the left half of the frame are shifted at block 604 to align symbols into the row-aligned format 606. In the row-aligned format, rows of the symbols from the de-interleaved format are aligned in respective rows. Rows of the braided FEC format are FEC decoded using corresponding FEC datagrams at block 608. After FEC decoding rows, columns of the row-aligned format 606 are shifted at block 610 to rearrange symbols into the column-aligned format 612. In the column-aligned format 612, columns of symbols in the de-interleaved format are aligned in respective rows. Columns of the de-interleaved format are FEC decoded using corresponding FEC datagrams at block 614.

As described above, multiple iterations of row and column decoding may be performed to correct a larger number of data symbols in error. Generally, the number of iterations required to correct most or all errors depends on the signal-to-noise ratio of the system or equivalently the input bit-error-rate of the system. The input bit error rate refers to the ratio of number of bits in error to the total number of bits. Deadlock patterns can occur and in such a case a block of bits cannot be entirely corrected using FEC decoding. If more iterations are to be performed, decision block 616 directs the process to block 618, where columns of the column-aligned format 612 are shifted to rearrange symbols into the row-aligned format 606. Row decoding, shifting of blocks, and column decoding are then repeated as described above with reference to blocks 608, 610, 612 and 614. If no more decoding iterations are to be performed, the right half of columns of the column-aligned format 612 are shifted at block 620 to rearrange the corrected symbols back into the interleaved format 622.

For ease of explanation, examples are primarily described with reference to decoding stages or iterations, in which row decoding is performed followed by column decoding, as shown in FIG. 6. However, the embodiments are not so limited. Rather, references to rows and columns may be interchanged. For instance, in each iteration, column decoding may be performed first followed by row decoding.

Figure 7:
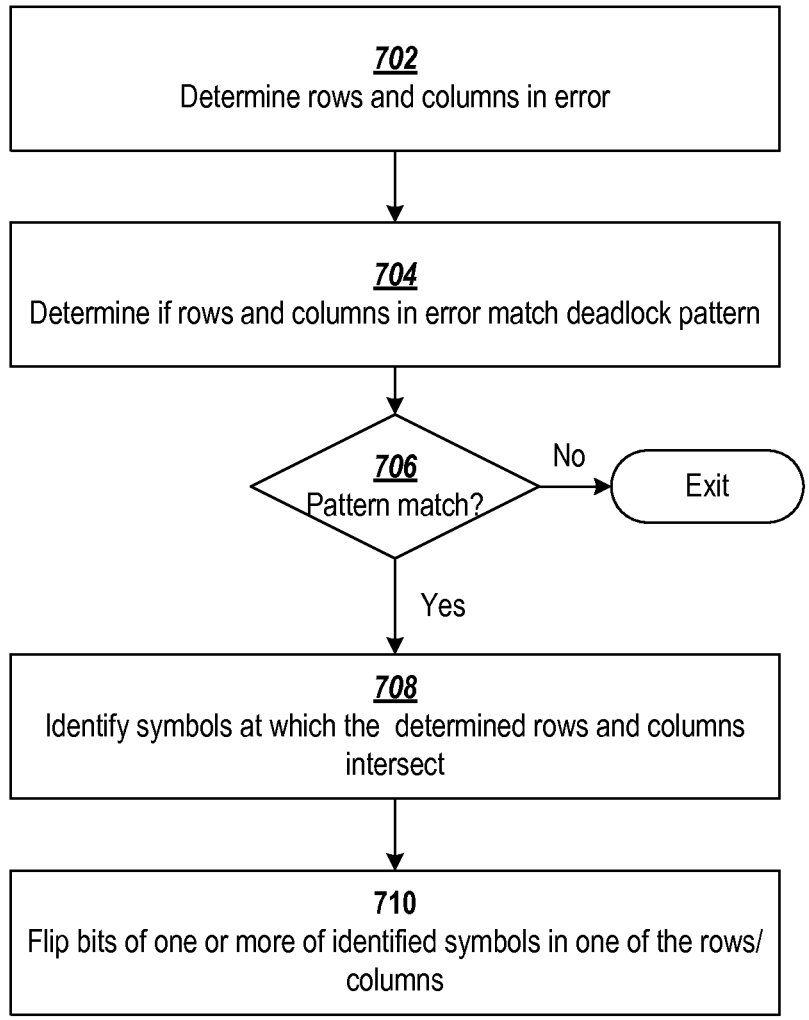
FIG. 7 shows a method for detecting and overcoming deadlock scenarios for decoding of braided FEC encoded data.

FIG. 7 shows a method for detecting and overcoming deadlock scenarios for decoding of braided FEC encoded data. Rows and columns of a data block in error are determined at block 702. At block 704, it is determined whether the rows and columns in error match a deadlock pattern. If the rows and columns in error do not match a deadlock pattern, decision block 706 directs the process to exit. Otherwise, at block 708, the process identifies symbols at which the determined rows in error intersect with the determined columns in error. At block 710, bits of one or more of the identified symbols at the insect points are inverted to remove the deadlock.

Deadlock may arise from a number of error distribution patterns. For ease of reference error distribution patterns that result in deadlock may be referred to as either a deadlock pattern or a deadlock scenario, and such terms may be used interchangeably herein.

Figure 8:
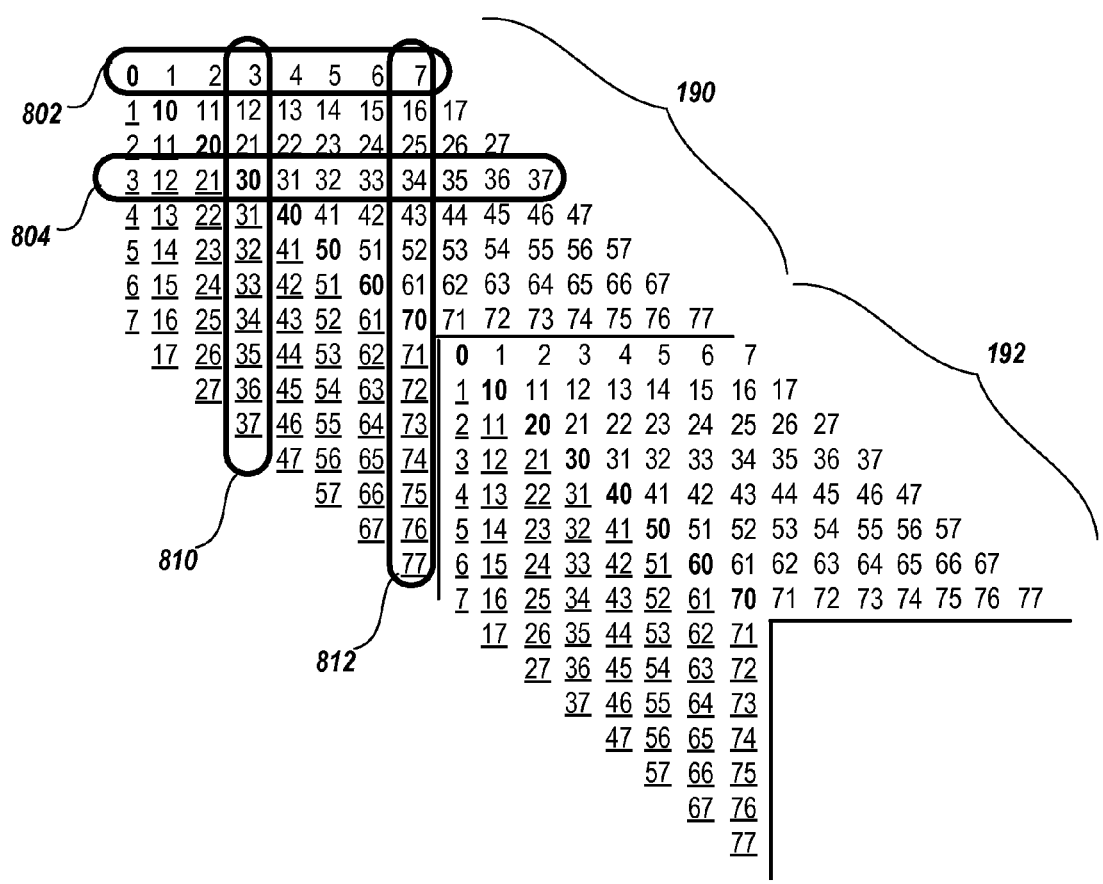
FIG. 8 illustrates a first deadlock scenario in the diagonal two-dimensional matrix of data symbols encoded with a braided FEC code.
Figure 9:
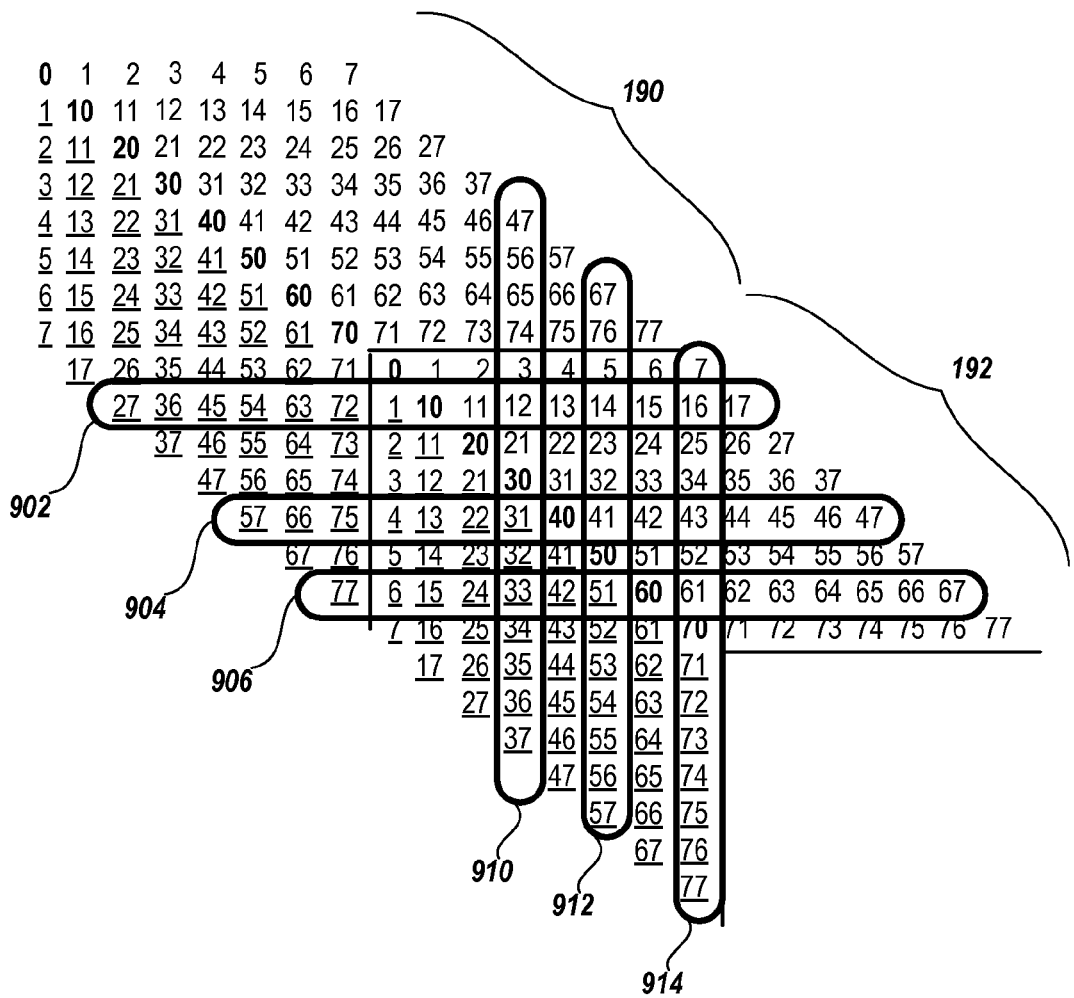
FIG. 9 illustrates a second deadlock scenario in the diagonal two-dimensional matrix of data symbols encoded with a braided FEC code.

FIGS. 8 and 9 and examples 1 through 18 discuss a number of deadlock scenarios. For ease of explanation, the deadlock scenarios are discussed with reference to FEC decoding of rows and columns encoded with BCH (1023, 991) code, which can correct up to three bits in error. Although, the distribution and number of errors that present deadlock for other FEC codes may be different, the disclosed methods may be adapted to remove deadlock presented for other FEC codes in a similar manner—by inverting bits of one or more symbols, at which the rows and columns in error intersect.

FIG. 8 illustrates a first deadlock scenario in the diagonal two-dimensional matrix of data symbols for braided FEC encoded data. In this example, deadlock is created by two rows 802 and 804 in error that both intersect with columns 810 and 812 that are also in error. Four data symbols in error are located where the two rows 802 and 804 and the two columns 810 and 812 intersect. If each row/column in error includes two of the symbols in error and has at least four bits in error, deadlock occurs since in the example only three bits can be corrected. Decoding is deadlocked because none of these intersecting rows/columns in error can be corrected using parity data of the row/column. As both the row and the column of each symbol are in error, the data symbols cannot be corrected by alternating between row and column FEC decoding, as discussed above. Accordingly, the scenario presents a deadlock situation. For ease of reference, a deadlock scenario presented by symbols at intersections between two rows in error and two columns in error may be referred to as a 2×2 deadlock scenario.

Examples 1 and 2 illustrate error distribution patterns that present a 2×2 deadlock scenario, as discussed above. The four numbers shown in each example indicate a number of bits in error in the data symbols where the two rows and two columns intersect. In Example 1, the left-most group of numbers represents the number of bit errors in each of the four data symbols, where the two rows in error and the two columns in error intersect. In this example, each of the four symbols includes two bits in error. As a result, each of the two rows and two columns in error includes a total of four bits in error, which cannot be recovered with BCH (1023, 991) code. It is recognized, however, that by inverting all bits of these data symbols in at least one row or column, the number of bits of the symbol in error is reduced from 2 to 1.

As shown in Example 1, inverting the bits of the two symbols in the top row may reduce the number of bits in error in each symbol from 2 to 1. The result is depicted as the next group of numbers to the right. As a result of the inverting, the total number of bits in error in the top row is reduced to two, which is correctable. As shown in the next two groups of numbers to the right in Example 1, the remaining errors can be corrected by performing FEC decoding of rows followed by FEC decoding of columns.

$$2\ 2 \rightarrow \text{Invert} \rightarrow 1\ 1 \rightarrow \text{Row} \rightarrow 0\ 0 \rightarrow \text{Col} \rightarrow 0\ 0 \quad \text{Example 1}$$
$$2\ 2 \rightarrow \text{Bits} \rightarrow 2\ 2 \rightarrow FEC \rightarrow 2\ 2 \rightarrow FEC \rightarrow 0\ 0$$

Example 2 shows another error distribution pattern that presents a 2×2 deadlock scenario. The left-most group of numbers represents the number of bit errors in each of the four data symbols where the two rows in error and the two columns in error intersect. In each of the two rows and columns, one of the data symbols includes 1 bit in error and the other symbols includes 3 bits in error. As a result, each of the two rows and two columns in error includes four bits in error—which cannot be recovered using FEC decoding of these rows and columns. As illustrated by the next group of numbers to the right, flipping the bits of the two symbols in the top row may reduce the number of bits in error in the row from 4 to 2. As illustrated by the next two groups of numbers to the right, the remaining errors can be corrected by performing FEC decoding of rows followed by FEC decoding of columns.

$$1\ 3 \rightarrow \text{Invert} \rightarrow 2\ 0 \rightarrow \text{Row} \rightarrow 0\ 0 \rightarrow \text{Col} \rightarrow 0\ 0 \quad \text{Example 2}$$
$$3\ 1 \rightarrow \text{Bits} \rightarrow 3\ 1 \rightarrow FEC \rightarrow 3\ 1 \rightarrow FEC \rightarrow 0\ 0$$

In different implementations, bits of different ones of the symbols may be inverted to escape the deadlock situation. In some situations, inverting bits of only one symbol may be sufficient to escape the 2×2 deadlock scenario. For instance, inverting bits in any of the symbols in Example 1 is sufficient to escape deadlock. However, inverting bits in only one symbol will not always be sufficient. For instance, if bits in the top-left symbol in Example 2 are inverted, the number of errors may be increased. By inverting bits in both of the symbols in error in at least one of the rows or columns in error, as shown in Examples 1 and 2, escape from deadlock can be ensured. In another implementation, bits may be inverted in all of the data symbols at which the rows and columns in error intersect.

Examples 1 and 2 each include a total of 8 bits in error. However the two-row-two-column error scenario may include a larger number of bits in error. For instance, Examples 3-6 show 2×2 deadlock scenarios that include nine bits in error. Examples 7-8 show 2×2 deadlock scenarios that include ten bits in error. Examples 9-12 show 2×2 deadlock scenarios that include eleven bits in error. For each of the scenarios shown in Examples 3-12, deadlock can be escaped by inverting bits in both of the symbols in error in one of the rows or columns in error, as described above with reference to examples 1 and 2. In some implementations, deadlock is escaped by inverting bits in the symbols in error in the rows or columns that includes the largest number of errors.

| | |
|---|---|
| 2 3 | Example 3 |
| 2 2 | |
| 3 2 | Example 4 |
| 2 2 | |
| 2 2 | Example 5 |
| 3 2 | |
| 2 2 | Example 6 |
| 2 3 | |
| 3 3 | Example 7 |
| 2 2 | |
| 2 2 | Example 8 |
| 3 3 | |
| 3 2 | Example 9 |
| 3 3 | |
| 2 3 | Example 10 |
| 3 3 | |
| 3 3 | Example 11 |
| 2 3 | |
| 3 3 | Example 12 |
| 3 2 | |

FIG. 9 illustrates a second deadlock scenario in the diagonal two-dimensional matrix of data symbols for braided FEC encoded data. In this example, deadlock is created by three rows in error (902, 904, and 906) that all intersect with the same three columns in error (910, 912, and 914). Symbols in error are located at points where rows 902, 904, and 906 intersect columns 910, 912, and 914. In this arrangement, each row/column in error includes three of the symbols in error and has at least four bits in error, which cannot be corrected by FEC decoding, for example, of BCH (1023, 991) encoded data. As both the row and the column of each symbol are in error, the data symbols cannot be corrected by alternating between row and column FEC decoding. For ease of reference, a deadlock scenario presented by symbols at intersections between three rows in error and three columns in error may be referred to as a 3×3 deadlock scenario.

Examples 13-18 show 6 different error distribution patterns with 12 errors that cause a 3×3 deadlock scenario. In each of these examples, deadlock can be escaped, for example, by inverting bits of the symbols in error in one of the rows in error. The remaining errors can be corrected by performing FEC decoding of columns, followed by FEC decoding of rows, followed by FEC decoding of columns.

In Example 13, a 3×3 deadlock scenario is shown by the left-most group of numbers and may be escaped by inverting bits of the symbols in error in the top row. The result of the inverting is shown in the next group of numbers to the right. As shown therein, the number of errors in the left column is reduced to 3, which is correctable. As shown in the next three groups of symbols to the right, the remaining errors may corrected by FEC decoding of columns, followed by FEC decoding of rows, followed by FEC decoding of columns. Similarly, deadlock may alternatively be escaped by inverting bits of symbols in error of one of the columns in error followed by FEC decoding of rows, FEC decoding of columns, and FEC decoding of rows.

```
2 1 1 → Invert → 1 2 2 → Col →              Example 13
1 2 1 →  Top   → 1 2 1 → FEC →
1 1 2 →  Row   → 1 1 2 →      →

0 2 2 → Row → 0 2 2 → Col → 0 0 0
         0 2 1 → FEC → 0 0 0 → FEC → 0 0 0
         0 1 2 →       → 0 0 0 →     → 0 0 0
```

In each of the Examples 14-18, deadlock can be escaped by inverting bits of the symbols in error in one of the rows/columns in error as described with reference to Example 13. For example, in some implementations, deadlock is escaped by inverting bits of the symbols in error in the rows or columns that includes the largest number of errors. In some other embodiments, deadlock is escaped by inverting bits of a subset of the determined symbols located along a diagonal line of the symbols. For instance, in example 14, a first diagonal line includes the left-most symbol in the top row, the middle symbol in the middle row, and the right-most symbol in the bottom row. A second diagonal line includes the left-most symbol in the bottom row, the middle symbol in the middle row, and the right-most symbol in the top row.

After inverting bits of the symbols in error, the remaining errors can be corrected by performing one and a half FEC decoding iterations including either 1) FEC decoding of rows, FEC decoding of columns, and FEC decoding of rows; or 2) FEC decoding of columns, FEC decoding of rows, and FEC decoding of columns.

```
1 2 1                            Example 14
2 1 1
1 1 2

1 2 1                            Example 15
1 1 2
2 1 1

1 1 2                            Example 16
1 2 1
2 1 1

2 1 1                            Example 17
1 1 2
1 2 1

1 1 2                            Example 18
2 1 1
1 2 1
```

Other distributions of errors may present other 3×3 and/or 2×2 deadlock scenarios. For instance, Examples 19 and 20 show a 3×3 deadlock scenario which may also present a 2×2 deadlock scenario after the 3×3 deadlock scenario is escaped, depending on which row/column is inverted. As described with reference to the above examples, the 3×3 deadlock scenario may be escaped by inverting bits of one of the row/columns in error. In Example 19, deadlock is escaped by flipping bits of the left-most column in error followed by row, column, row FEC decoding to correct the remaining errors

```
2 1 1 → Invert → 1 1 1 → Row →              Example 19
0 2 2 →  Left  → 3 2 2 → FEC →
2 1 1 →  Col   → 1 1 1 →      →

0 0 0 → Col → 0 0 0 → Col → 0 0 0
         3 2 2 → FEC → 0 0 0 → FEC → 0 0 0
         0 0 0 →       → 0 0 0 →     → 0 0 0
```

However, as shown in Example 20, if the 3×3 deadlock scenario is instead escaped by inverting the top row, followed by column, row, column FEC decoding, a new 2×2 deadlock scenario is encountered. This 2×2 can also be resolved by applying the deadlock correction circuitry a second time followed by 2 more iterations of row and column decoding. Thereby, the 2×2 cell deadlock is also corrected as mentioned in the previous section. It may also be possible to correct both 2×2 and 3×3 deadlock scenarios by inverting bits along the row or column having the most errors. If the number of row errors is greater than the number of column errors, bits are inverted along the rows, and if the number of column errors is greater than the number of row errors, bits are inverted first along the columns.

```
2 1 1 → Invert → 1 2 2 → Col →              Example 20
0 2 2 →  Top   → 0 2 2 → FEC →
2 1 1 →  Row   → 2 1 1 →      →

0 2 2 → Row → 0 2 2 → Col → 0 2 2
         0 2 2 → FEC → 0 2 2 → FEC → 0 2 2
         0 1 1 →       → 0 0 0 →     → 0 0 0
```

Figure 10:
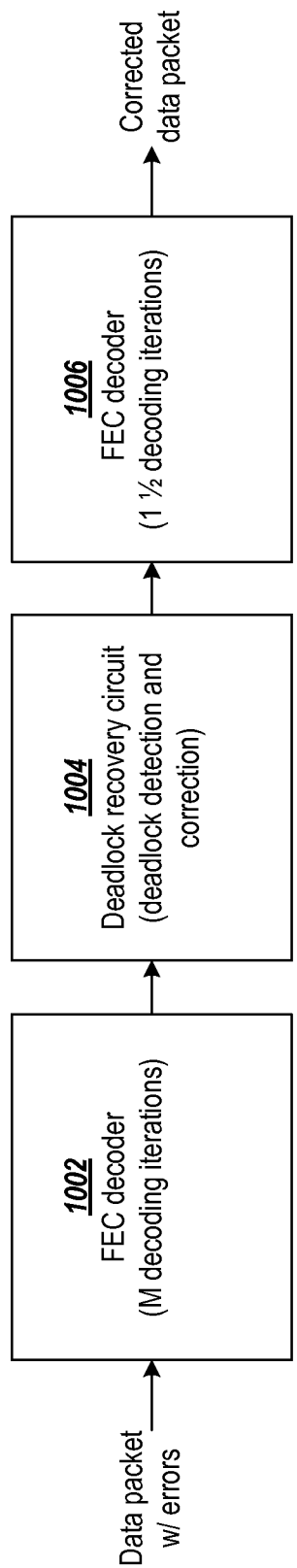
FIG. 10 shows a circuit for decoding of braided FEC coded data symbols and overcoming deadlock scenarios.

FIG. 10 shows a circuit for decoding of braided FEC encoded symbols and overcoming deadlock scenarios. The circuit includes a first FEC decoder 1002 configured to receive a data packet of symbols in the interleaved format and perform M decoding iterations of the symbols, for example, as described with reference to FIG. 6. A deadlock recovery circuit 1004 is coupled to an output of the first FEC decoder 1002 and is configured to determine if the symbols have errors distributed in a deadlock pattern, as discussed with reference to FIGS. 7 through 9. If deadlock is detected, the deadlock recovery circuit 1004 inverts bits of one or more symbols in error to escape deadlock, as discussed above.

A second FEC decoder 1006 is coupled to an output of the deadlock recovery circuit 1004. The second FEC decoder 1006 is configured to correct any remaining errors by performing one and a half FEC decoding iterations. More specifically, if the deadlock recovery circuit 1004 escapes the deadlock scenario by inverting bits of symbols of a column in error, the second FEC decoder 1006 performs FEC decoding of rows, followed by FEC decoding of columns, followed by FEC decoding of rows. Alternatively, if the deadlock recovery circuit 1004 escapes the deadlock scenario by inverting bits of symbols of a row in error, the second FEC decoder 1006 performs FEC decoding of columns, followed by FEC decoding of rows, followed by FEC decoding of columns.

Figure 11:
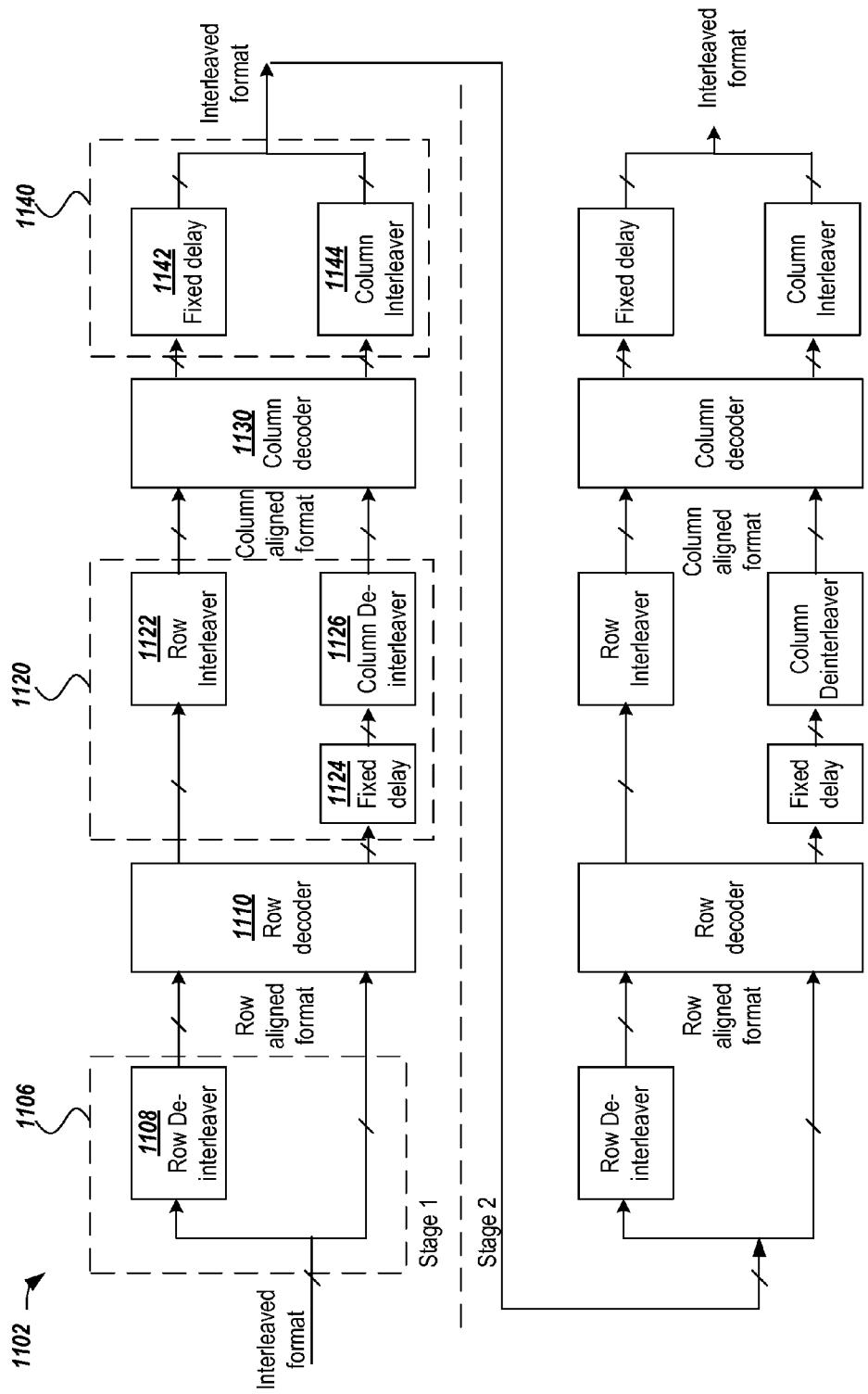
FIG. 11 shows a decoder pipeline for performing a set of FEC decoding iterations for braided FEC coded data symbols.

FIG. 11 shows a decoder pipeline for performing a plurality of FEC decoding iterations for braided FEC encoded symbols. The decoder pipeline may be used, for example, to implement the first FEC decoder 1002 in FIG. 10. In this example, the pipeline includes decoding stages 1102 and 1104 connected in series to perform two iterations, each including row decoding followed by column decoding. However, the pipeline may be implemented using other numbers of decoding stages as well.

As shown by the first decoding stage 1102, each decoding stage includes a first formatting circuit 1106 configured to receive the braided FEC encoded symbols in the interleaved format having L columns and to rearrange the symbols into the row-aligned format. In this example, the first formatting circuit includes a row de-interleaver circuit 1108 configured to delay the leftmost $(L-1)/2$ columns of the symbols in the interleaved format as described with reference to FIG. 3.

Each decoding stage includes a row decoding circuit 1110 coupled to receive the braided FEC encoded symbols in the row-aligned format from the first formatting circuit 1106. The row decoder is configured to perform FEC decoding of the rows of the data symbols in the row-aligned format (i.e., rows of the de-interleaved format) using respective FEC datagrams.

Each decoding stage includes a second formatting circuit 1120 coupled to receive the corrected symbols in the row-aligned format from the row-decoding circuit 1110 and is configured to place the symbols into the column-aligned format. As described with reference to FIG. 4, data symbols in the row-aligned format may be rearranged into the column-aligned format by delaying symbols in each column by a number of delay units equal to an index of the column (0 to $L-1$ from the leftmost column to the rightmost column).

In this example, the second formatting circuit includes a row interleaver circuit 1122 configured to delay each of the $(L-1)/2$ leftmost columns by a number of delay units equal to an index of the column. The columns are indexed 0 to $L-1$, from the leftmost column to the rightmost column. The second formatting circuit also includes a fixed delay circuit 1124 and a column de-interleaver circuit 1126, which together are configured to delay each of the $(L-1)/2$ rightmost columns by a number of delay units equal to an index of the column. The fixed delay circuit 1124 delays each of the $(L-1)/2$ rightmost columns by $(L-1)/2$ delay units. The column de-interleaver circuit 1126 further delays each of the $(L-1)/2$ rightmost columns by a number of delay units equal to an index of the column (M) minus $(L-1)/2$.

Each decoding stage also includes a column decoder circuit 1130 coupled to receive the symbols in the column-aligned format from the second formatting circuit 1120. The column decoder circuit 1130 is configured to perform FEC decoding on the rows of the data symbols in the column-aligned format (i.e., columns of the de-interleaved format) using respective FEC datagrams.

Each decoding stage includes a third formatting circuit 1140 coupled to receive the corrected symbols in the column-aligned format from the column-decoding circuit 1130 and configured to place the symbols into the interleaved format shown in FIG. 2. Symbols in the column-aligned format may be placed in the interleaved format by delaying the $(L+1)/2$ leftmost columns by $(L-1)/2$ delay units and delaying the $(L-1)/2$ rightmost columns by a respective number of delay units equal to $L-M$, where M is the index of the column.

In this example, the third formatting circuit 1140 includes a fixed delay circuit 1142 configured to delay each of the $(L+1)/2$ leftmost columns of the corrected symbols in the column-aligned format by $(L-1)/2$ delay units. The third formatting circuit 1140 also includes a column interleaver circuit 1144 configured to delay each of the $(L-1)/2$ rightmost columns by a respective number of delay units equal to $M-((L-1)/2)$.

In some embodiments, the first, second, or third formatting circuits (1106, 1120, and 1140) may be implemented with additional delay. For instance, the row interleaver 1122, fixed delay circuit 1124, and a column de-interleaver circuit 1126 of the second formatting circuit 1120 may be configured to further delay each column by an additional delay unit.

Figure 12:
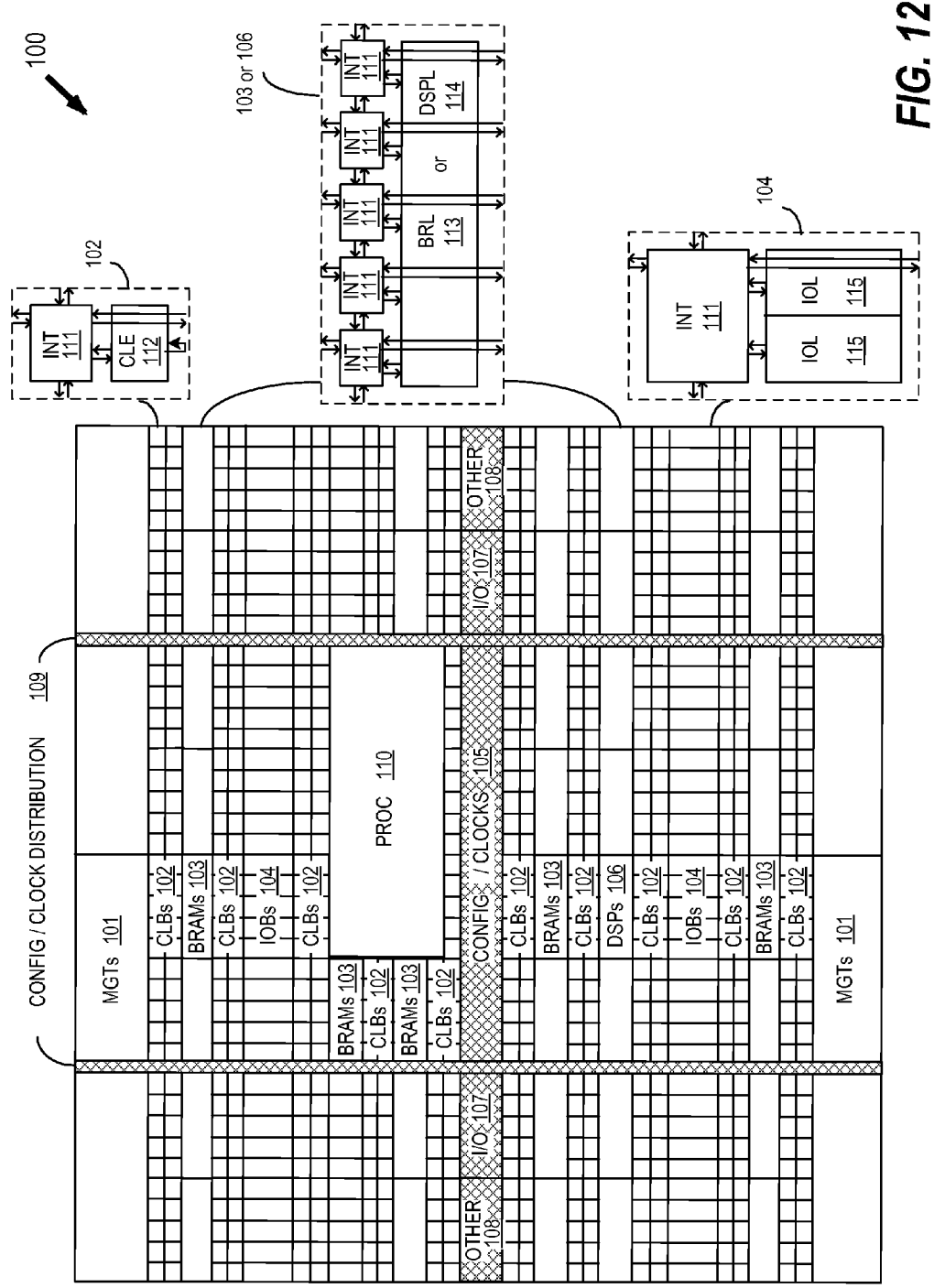
FIG. 12 shows a programmable IC that may be configured to implement one or more of the disclosed circuits.

FIG. 12 is a block diagram of an example programmable logic integrated circuit (IC) that may be used in implementing an FEC decoder and/or deadlock recovery circuit. The programmable IC shown in FIG. 12 is known as a field programmable gate array (FPGA). FPGAs can include several different types of programmable logic blocks in the array. For example, FIG. 12 illustrates an FPGA architecture (100) that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107), for example, e.g., clock ports, and other programmable logic 108 such as digital clock managers, analog-to-digital converters, system monitoring logic, and so forth. Some FPGAs also include dedicated processor blocks (PROC 110) and internal and external reconfiguration ports (not shown).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element INT 111 also includes the connections to and from the programmable logic element within the same tile, as shown by the examples included at the top of FIG. 12.

For example, a CLB 102 can include a configurable logic element CLE 112 that can be programmed to implement user logic plus a single programmable interconnect element INT 111. A BRAM 103 can include a BRAM logic element (BRL 113) in addition to one or more programmable interconnect elements. Typically, the number of interconnect elements included in a tile depends on the height of the tile. In the pictured FPGA, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element INT 111. As will be clear to those of skill in the art, the actual I/O pads connected, for example, to the I/O logic element 115 are manufactured using metal layered above the various illustrated logic blocks, and typically are not confined to the area of the input/output logic element 115.

In the pictured FPGA, a columnar area near the center of the die (shown shaded in FIG. 12) is used for configuration, clock, and other control logic. Horizontal areas 109 extending from this column are used to distribute the clocks and configuration signals across the breadth of the FPGA.

Some FPGAs utilizing the architecture illustrated in FIG. 14 include additional logic blocks that disrupt the regular columnar structure making up a large part of the FPGA. The additional logic blocks can be programmable blocks and/or dedicated logic. For example, the processor block PROC 110 shown in FIG. 14 spans several columns of CLBs and BRAMs.

Note that FIG. 12 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 14 are purely exemplary. For example, in an actual FPGA more than one adjacent column of CLBs is typically included wherever the CLBs appear, to facilitate the efficient implementation of user logic.

Figure 13:
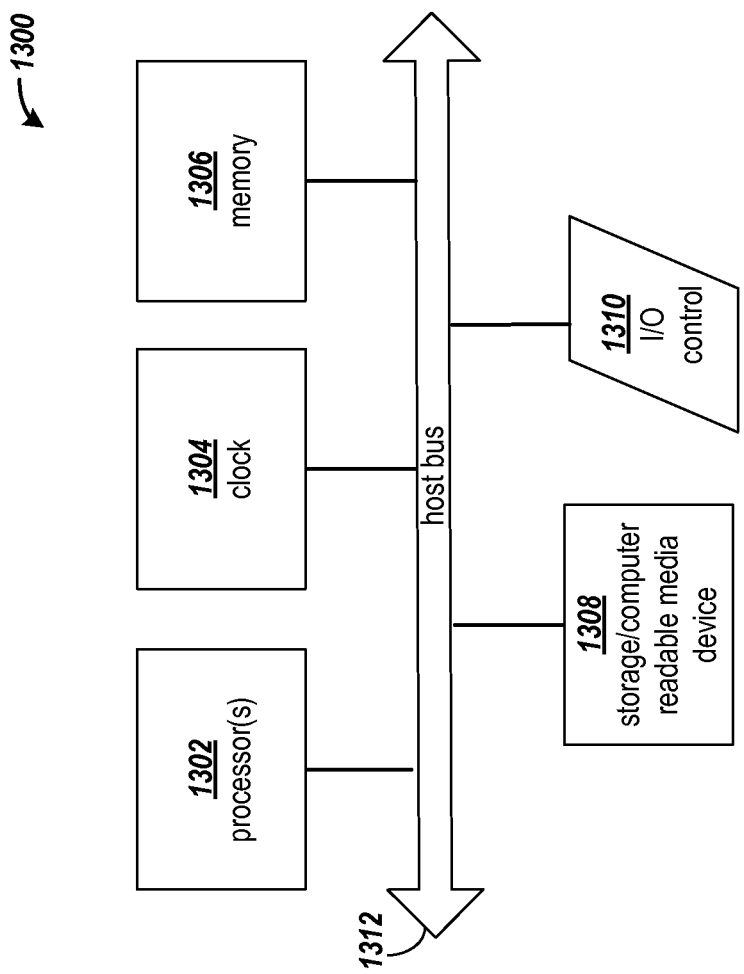
FIG. 13 shows a computing system that may be configured to implement one or more of the disclosed processes.

FIG. 13 shows a computing system that may be configured to perform the processes discussed in the above examples. It will be appreciated that various alternative computing arrangements, including one or more processors and a memory arrangement configured with program code, would be suitable for hosting the disclosed processes and/or components (e.g., simulation engine and configuration interface in FIG. 5). The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 1300 includes one or more processors 1302, a clock signal generator 1304, a memory arrangement 1306, a storage arrangement 1308, and an input/output control unit 1310, all coupled to a host bus 1312. The arrangement 1300 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 1302 may be one or more general purpose processors, or a combination of one or more general purpose processors and suitable co-processors, or one or more specialized processors (e.g., RISC, CISC, and/or pipelined).

The memory arrangement 1306 typically includes multiple levels of cache memory, and a main memory. The storage arrangement 1308 may include local and/or remote persistent storage, such as provided by magnetic disks (not shown), flash, EPROM, or other non-volatile data storage. The storage unit may be read or read/write capable. Further, the memory arrangement 1306 and storage arrangement 1308 may be combined in a single arrangement.

The processor(s) 1302 executes the software in storage arrangement 1308 and/or memory arrangement 1306, reads data from and stores data to the storage arrangement 1308 and/or memory arrangement 1306, and communicates with external devices through the input/output control arrangement 1310. These functions are synchronized by the clock signal generator 1304. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures disclosed herein. In addition, the processes may be provided via a variety of computer-readable storage media or delivery channels such as magnetic or optical disks or tapes, electronic storage devices, or as application services over a network.

The disclosed embodiments are thought to be applicable to a variety of systems for forward error correction. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A method for forward error correction (FEC) decoding, comprising:
   receiving a plurality of symbols in an interleaved format of rows and columns of the symbols;
   performing a plurality of FEC decoding iterations on the plurality of symbols, each decoding iteration including:
      performing FEC decoding of the rows of the plurality of symbols; and
      performing FEC decoding of the columns of the plurality of symbols;
   after performing the FEC decoding iterations, determining rows in error of the plurality of symbols and columns in error of the plurality of symbols; and
   in response to the determined rows in error and the determined columns in error matching a deadlock pattern of a set of deadlock patterns:
      determining symbols of the plurality of symbols at intersections of the determined rows in error and the determined columns in error; and
      inverting bits of one or more symbols of the determined symbols; and
   performing one or more of the FEC decoding iterations after the inverting of the bits.

2. The method of claim 1, wherein each FEC decoding iteration further includes:
   rearranging the plurality of symbols to place the plurality of symbols in a row-aligned format; and
   rearranging the plurality of symbols to place the plurality of symbols in a column-aligned format.

3. The method of claim 1, wherein the inverting bits of the one or more symbols includes selecting the one or more symbols whose bits are to be inverted as a function of the determined deadlock pattern.

4. The method of claim 1, wherein:
the rows and columns of the plurality of symbols includes at least one row and at least one column that are non-intersecting; and
the set of deadlock patterns includes:
a first pattern in which the determined rows and columns include two rows and two columns, and each of the two rows intersects each of the two columns; and
a second pattern in which the determined rows and columns include three rows and three columns, and each of the three rows intersects each of the three columns.

5. The method of claim 4, wherein the set of deadlock patterns further includes a third pattern in which the determined rows and columns either include 2 rows in error that intersect 3 columns in error or include 3 rows in error that intersect 2 columns in error.

6. The method of claim 1, wherein the inverting bits of the one or more symbols of the determined symbols includes inverting bits of all of the determined symbols in one of the determined rows in error.

7. The method of claim 1, wherein the inverting of bits of the one or more symbols of the determined symbols includes inverting bits of a single one of the determined symbols in one of the determined rows in error.

8. The method of claim 1, wherein the inverting of bits of the one or more symbols of the determined symbols includes inverting bits of all of the determined symbols in one of the determined columns in error.

9. The method of claim 1, wherein the inverting of bits of the one or more symbols of the determined symbols includes inverting bits of a subset of the determined symbols located along a diagonal line of the plurality of symbols in a de-interleaved format.

10. The method of claim 1, wherein the inverting of bits of the one or more symbols of the determined symbols includes:
selecting one of the rows or columns of the plurality of symbols that includes the largest number of errors; and
inverting bits of symbols where the selected one of the rows or columns intersects other ones of the determined rows and columns in error.

11. The method of claim 1, wherein one or more of the FEC decoding iterations performed after the inverting of the bits includes:
placing the plurality of symbols in a row-aligned format and performing FEC decoding of the rows of the plurality of symbols;
following the FEC decoding of the rows, placing the plurality of symbols in a column-aligned format and performing FEC decoding of the columns of the plurality of symbols; and
following the FEC decoding of the columns, placing the plurality of symbols in the row-aligned format and performing FEC decoding of the rows of the plurality of symbols.

12. A circuit for forward error correction (FEC) decoding, comprising:
a first FEC decoder configured and arranged to:
receive a first set of symbols in an interleaved format having rows of the first set of symbols interleaved with columns of the first set of symbols; and
perform a plurality of FEC decoding iterations on the first set of symbols to produce a second set of symbols, each decoding iteration including FEC decoding of the rows of the first set of symbols and FEC decoding of the columns of the first set of symbols; and
a deadlock recovery circuit coupled to the first FEC decoder and configured to:
determine rows and columns of symbols in error in the second set of symbols; and
in response to the determined rows and columns of symbols in error matching a deadlock pattern, invert bits of one or more symbols of the second set of symbols at intersection points of the determined rows and columns of symbols in error to produce a third set of symbols; and
a second FEC decoder coupled to the deadlock recovery circuit and configured and arranged to perform one or more of the FEC decoding iterations on the third set of symbols.

13. The circuit of claim 12, wherein each of the plurality of FEC decoding iterations performed by the first FEC decoder includes:
rearranging the first set of symbols to place the first set of symbols in a row-aligned format and performing the FEC decoding of the rows of the first set of symbols in the row-aligned format; and
rearranging the first set of symbols to place the first set of symbols in a column-aligned format and performing the FEC decoding of the columns of the first set of symbols in the column-aligned format.

14. The circuit of claim 12, wherein the deadlock recovery circuit is further configured to select the one or more symbols whose bits are to be inverted as a function of the deadlock pattern that matches the determined rows and columns of symbols in error.

15. The circuit of claim 12, wherein the deadlock recovery circuit is configured to determine a row in the second set of symbols that includes the largest number of errors, and invert bits of symbols at which the row intersects with the determined columns of the second set of symbols in error.

16. The circuit of claim 15, wherein the second FEC decoder is configured to:
place the third set of symbols in a column-aligned format and perform FEC decoding of the columns of the third set of symbols;
following the FEC decoding of the columns, place the third set of symbols in a row-aligned format and perform FEC decoding of the rows of the third set of symbols; and
following the FEC decoding of the rows, place the third set of symbols in the column-aligned format and perform FEC decoding of the column of the plurality of symbols.

17. The circuit of claim 12, wherein the deadlock recovery circuit is configured to determine a column in the second set of symbols that includes the largest number of errors, and invert bits of symbols at which the column intersects with the determined rows of the second set of symbols in error.

18. The circuit of claim 17, wherein the second FEC decoder is configured to:
place the third set of symbols in a row-aligned format and perform FEC decoding of the rows of the third set of symbols;
following the FEC decoding of the rows, place the third set of symbols in a column-aligned format and perform FEC decoding of the columns of the third set of symbols; and
following the FEC decoding of the columns, place the third set of symbols in the row-aligned format and perform FEC decoding of the rows of the plurality of symbols.

19. The circuit of claim 12, wherein the deadlock recovery circuit is configured to invert bits of symbols along a diagonal line of the second set of symbols in a de-interleaved format.

20. The circuit of claim 12, wherein the deadlock pattern matching rows and columns of symbols includes two or more rows in error that intersect with two or more columns in error.

\* \* \* \* \*